(12) United States Patent
Ushiyama

(10) Patent No.: US 8,448,125 B2
(45) Date of Patent: May 21, 2013

(54) METHOD AND APPARATUS FOR CHECKING CURRENT DENSITY LIMITATION

(75) Inventor: Kenichi Ushiyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 283 days.

(21) Appl. No.: 11/979,834

(22) Filed: Nov. 8, 2007

(65) Prior Publication Data

US 2008/0184177 A1 Jul. 31, 2008

(30) Foreign Application Priority Data

Jan. 30, 2007 (JP) .................................. 2007-19264

(51) Int. Cl.
*G06F 17/50* (2006.01)
(52) U.S. Cl.
USPC .......................................... 716/136; 716/109
(58) Field of Classification Search
USPC ............... 716/1, 4, 5, 106–109, 136; 257/691
See application file for complete search history.

(56) References Cited

U.S. PATENT DOCUMENTS

| | | | |
|---|---|---|---|
| 7,398,489 B2 * | 7/2008 | Dinter et al. ....................... | 716/4 |
| 2002/0083403 A1 * | 6/2002 | Murayama ........................ | 716/5 |
| 2004/0049750 A1 * | 3/2004 | Gentry et al. ..................... | 716/5 |
| 2005/0022149 A1 * | 1/2005 | Smith et al. ...................... | 716/15 |
| 2006/0017158 A1 * | 1/2006 | Takahata ......................... | 257/734 |
| 2006/0031792 A1 * | 2/2006 | Zavadsky et al. ................. | 716/4 |
| 2006/0071319 A1 * | 4/2006 | Nishimura ..................... | 257/691 |
| 2006/0080630 A1 * | 4/2006 | Lin ................. | 716/11 |
| 2006/0123374 A1 * | 6/2006 | Douriet ........................... | 716/10 |
| 2006/0123377 A1 * | 6/2006 | Schultz et al. ................... | 716/11 |
| 2006/0226530 A1 * | 10/2006 | Dinter et al. .................. | 257/691 |
| 2007/0033555 A1 * | 2/2007 | Banoo et al. ...................... | 716/5 |
| 2007/0124715 A1 * | 5/2007 | Fujiyama et al. ............... | 716/10 |
| 2008/0034342 A1 * | 2/2008 | Petunin et al. .................. | 716/15 |
| 2008/0184177 A1 * | 7/2008 | Ushiyama ......................... | 716/4 |
| 2008/0263494 A1 * | 10/2008 | Takahata ......................... | 716/12 |

FOREIGN PATENT DOCUMENTS

| | | |
|---|---|---|
| JP | 05-082647 | 4/1993 |
| JP | 2005-251057 | 9/2005 |

OTHER PUBLICATIONS

Japanese Office Action for application No. 2007-019264 issued Sep. 18, 2012.

* cited by examiner

*Primary Examiner* — Binh Tat
(74) *Attorney, Agent, or Firm* — Staas & Halsey LLP

(57) ABSTRACT

A method of checking a current density limitation includes checking the current density limitation of a power supply wiring based on an allowable current value, the allowable current value depending on the number of vias connected to the power supply wiring.

14 Claims, 8 Drawing Sheets

FIG.7

81 FIRST TABLE

| POWER SUPPLY WIRING WIDTH ($\mu$m) | ALLOWABLE CURRENT VALUE OF POWER SUPPLY WIRING (A) |
|---|---|
| 1 | $I_{M1}$ |
| 2 | $I_{M2}$ |
| 3 | $I_{M3}$ |
| 4 | $I_{M4}$ |
| ⋮ | ⋮ |

FIG.8

82 SECOND TABLE

| ALLOWABLE CURRENT VALUE (A) | POWER SUPPLY WIRING WIDTH ($\mu$m) | | | | |
|---|---|---|---|---|---|
| | 1 | 2 | 3 | 4 | ····· |
| 1 | a | a | a | | ····· |
| 2 | | | . | | |
| | | | . | | |
| | | | . | | |
| NUMBER OF VIA CONNECTIONS  3 | ····· | | a3 | | |
| | | | . | | |
| 4 | | | . | | |
| | | | . | | |
| 5 | | | | | |
| . | | | | | |
| . | | | | | |
| . | | | | | |
| . | | | | | |
| . | | | | | |

METHOD AND APPARATUS FOR CHECKING CURRENT DENSITY LIMITATION

CROSS-REFERENCE TO RELATED APPLICATIONS

This application is based upon and claims the benefit of priority from the prior Japanese Patent Application No. 2007-019264, filed on Jan. 30, 2007, the entire contents of which are incorporated herein by reference.

BACKGROUND

1. Field

The embodiment relates to circuit design simulation, and especially relates to a method of checking current density limitation and an apparatus for checking current density limitation.

2. Description of the Related Art

During the design of Large Scale Integration (LSI) circuits by conventional simulation, current density limitation is checked using the results of a power consumption calculation and a current density calculation. The conventional current density limitation check is performed after cell placement, wiring on a substrate, and timing convergence on timing verification. The conventional current density limitation check compares the current value of each power supply wiring with the allowable current value of each power supply wiring. The current value flowing into each via connecting between the power supply wirings is compared to the allowable current value of each via. Finally, the current value flowing into each via is judged whether it is within the allowable current values or not.

The conventional LSI design method recognizes vias connecting between powers supply wiring, and power supply wirings that exist in the upper and lower layers for the power supply wiring, as a node. Therefore, the connection relation between the power supply wirings and the vias is not recognized accurately. As a result, the current density limitation check is performed by dividing power supply wirings and vias. An allowable current value on a connected field side with one via of a power supply wiring is set for an allowable current of a power supply wiring. Because the allowable current value of the power supply wiring is larger than the allowable current value on the connected field side, however, the allowable current value on the connected field side is used to judge whether the current value is within the allowable current values or not.

However, the conventional LSI design method underestimates the allowable current value of a power supply wiring, which results in increased Turn Around Time (TAT) and larger chip sizes, due to unnecessary reinforcement of power supply wiring and reallocation of cells.

SUMMARY

The embodiment provides a method of checking a current density limitation including checking the current density limitation of a power supply wiring based on an allowable current value depending on the number of vias connected to the power supply wiring.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWING

FIG. 7 illustrates the first table of the allowable current values for the power supply wiring that is used in step S251 of FIG. 6.

FIG. 8 illustrates the second table of the allowable current values that is used in step S252 of FIG. 6.

DETAILED DESCRIPTION OF THE PREFERRED EMBODIMENTS

Figure 1:
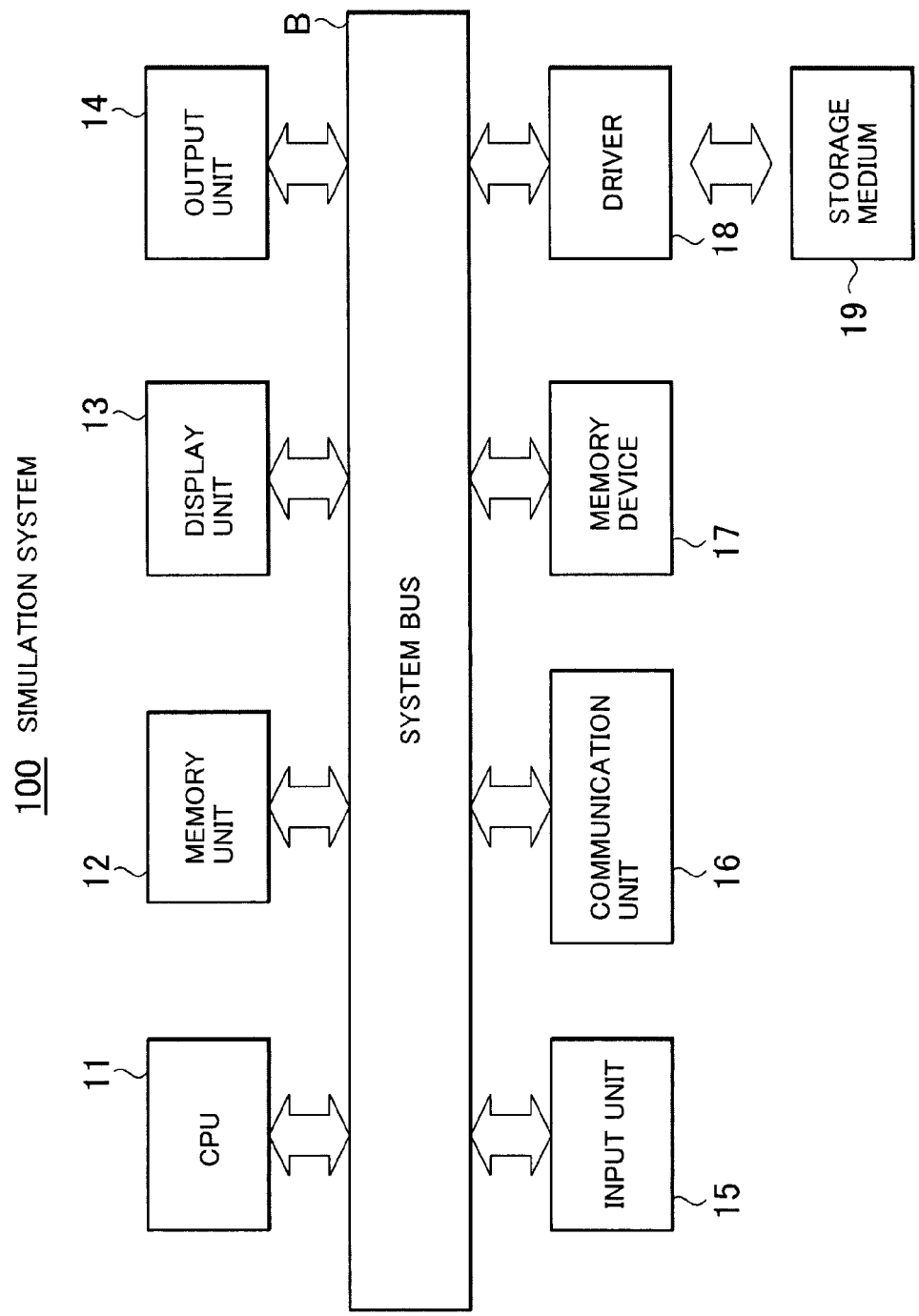
FIG. 1 illustrates a hardware configuration of the simulation system in accordance with an embodiment.

FIG. 1 illustrates a hardware configuration of a simulation system in accordance with an embodiment.

In FIG. 1, a simulation system 100 is controlled by a computer, and has a Central Processing Unit (CPU) 11, a memory unit 12, a display unit 13, an output unit 14, an input unit 15, a communication unit 16, a memory device 17, a driver 18, and a system bus B.

The CPU 11 of FIG. 1 controls the simulation system 100 according to the program stored in the memory unit 12. The memory unit 12 has a Random Access Memory (RAM) or a Read-Only Memory (ROM). The memory unit 12 stores the program executed at the CPU11, necessary data for the processing at the CPU 11, and data obtained by the processing at the CPU11. In addition, a partial area of the memory unit 12 is allocated as a work area used for the processing at the CPU11.

The display unit 13 of FIG. 1 displays various necessary information under the control of the CPU11. The output unit 14 has a printer, and is used to output various information according to instructions from users. The input unit 15 has a mouse and a keyboard, and is used for users to input various information necessary for the simulation system 100 to perform processing.

The communication unit 16 of FIG. 1 is a device for the simulation system 100 to control communication via network, for example, Internet and Local Area Network (LAN).

The memory device 17 of FIG. 1 has, for example, a hard disk unit. The memory device 17 stores data such as programs to execute various processing.

As shown in FIG. 1, a program that realizes processing by the circuit design method performed by the simulation system 100 is provided to the simulation system 100. The program may be stored in a storage medium 19 such as, for example, a Compact Disk Read-Only Memory (CD-ROM). If the storage medium 19 where the program is saved is set in a driver 18, the driver 18 reads the program from the storage medium 19. After reading, the program is installed in the memory device 17 via the system bus B. When the program starts, the CPU 11 starts processing based on the program installed in the memory device 17.

As further shown in FIG. 1, a storage medium to store the program is not limited to a CD-ROM, but may be any medium from which a computer can read. The program that realizes the processing of the embodiment can also be downloaded via a network by the communication unit 16 and installed in the memory device 17. Further, when the simulation system 100 has an interface such as a Universal Serial Bus (USB) that connects with the outside, the program can be read from an external storage media by a USB connection.

Figure 2:
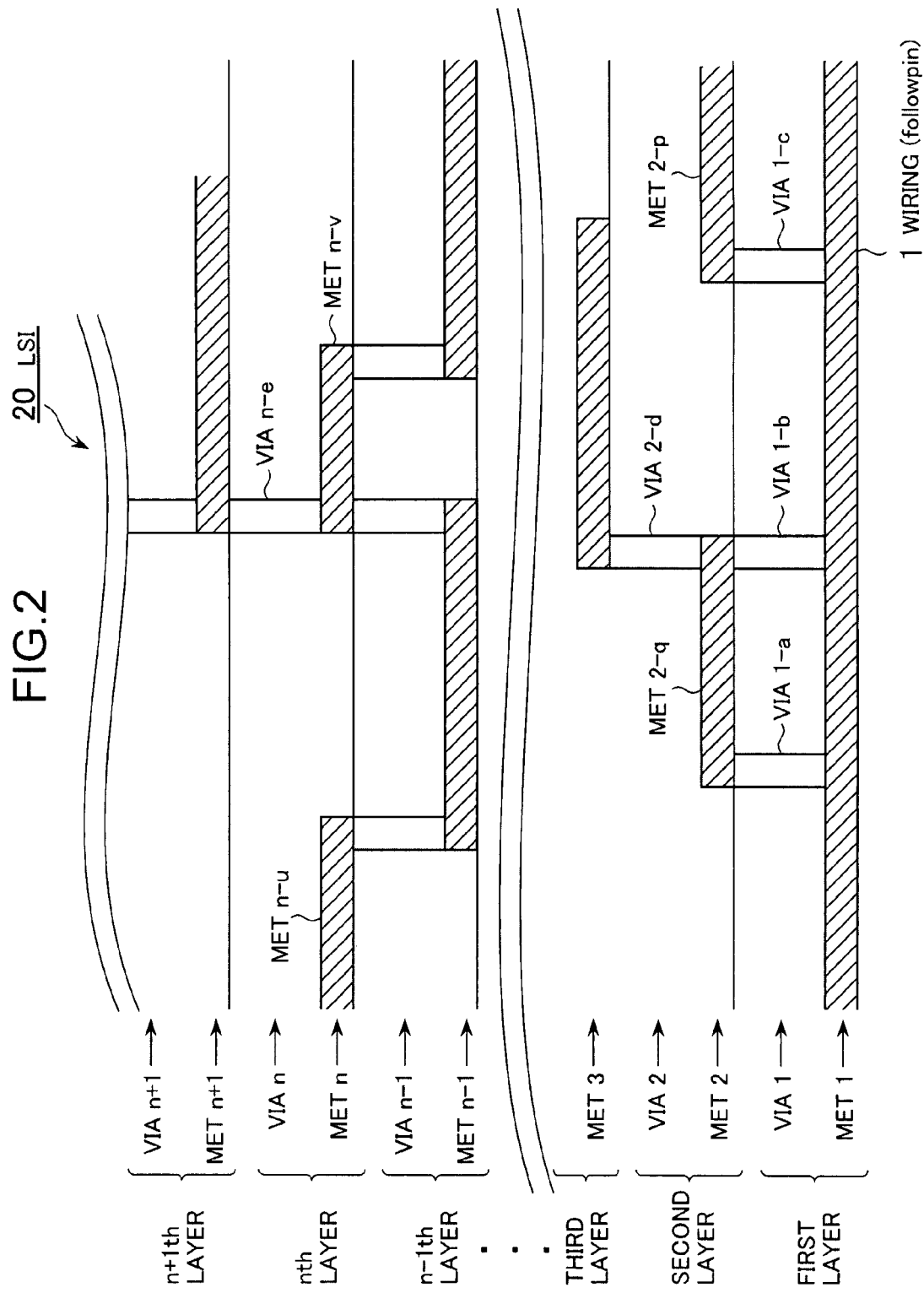
FIG. 2 illustrates a diagram of a power supply wiring layer and a via layer that are simulated by the simulation system of FIG. 1.

FIG. 2 illustrates a diagram of a power supply wiring layer and a via layer that are simulated by the simulation system of FIG. 1. As shown in FIG. 2, the design of LSI 20 has plural layers such as the first layer, the second layer, the third layer, . . . , the n−1$_{th}$ layer, the n$_{th}$ layer, and the n+1$_{th}$ layer, . . . . Each layer has a first power supply wiring layer (or power supply metal layer) MET1 and a first via layer VIA1. Each layer also has a second power supply wiring layer MET2 and a second via layer VIA2, a third power supply wiring layer MET3 and a third via layer VIA3, . . . , a n−1$_{th}$ power supply layer METn−1 and a n−1$_{th}$ via layer VIAn−1, a n$_{th}$ power supply wiring layer METn and a n$_{th}$ via layer VIAn, a n+1$_{th}$ power supply wiring n+1 and a n+1$_{th}$ via layer VIA n+1, . . . .

In the first power supply layer MET1 of FIG. 2, a power supply wiring 1a directly connected to power supply VDD or VSS is defined. The wiring 1a is especially called "follow pin." In addition, a via VIA1-a, a via VIA1-b, and a via VIA1-c are defined in the via layer VIA1.

In the second layer of FIG. 2, power supply wiring MET2-p and power supply wiring MET2-q are defined in the power supply wiring layer MET2. A via VIA2-d is defined in the via layer VIA2. Similarly, power supply wiring METn-u and power supply wiring METn-v are defined in the power supply wiring layer METn in a n$_{th}$ layer. In addition, a via VIAn-e is defined in the via layer VIAn.

The relationship between a power supply wiring layer and a via layer in each layer of FIG. 2 is defined by a net list. A via configuration name that identifies the structure of each via is associated with a defined via name. The configuration information including the number of vias is stored per via configuration name in the library. The via name is information to identify the connection location. The connection to the power supply wiring is designed with a single via or plural vias in the connection location.

Each of the via VIA1-a, the via VIA1-b, the via VIA1-c, the via VIA2-d, and the via VIAn-e, etc. shown in FIG. 2 consists of a single via or plural vias respectively. Each configuration is defined in the library.

Figure 3:
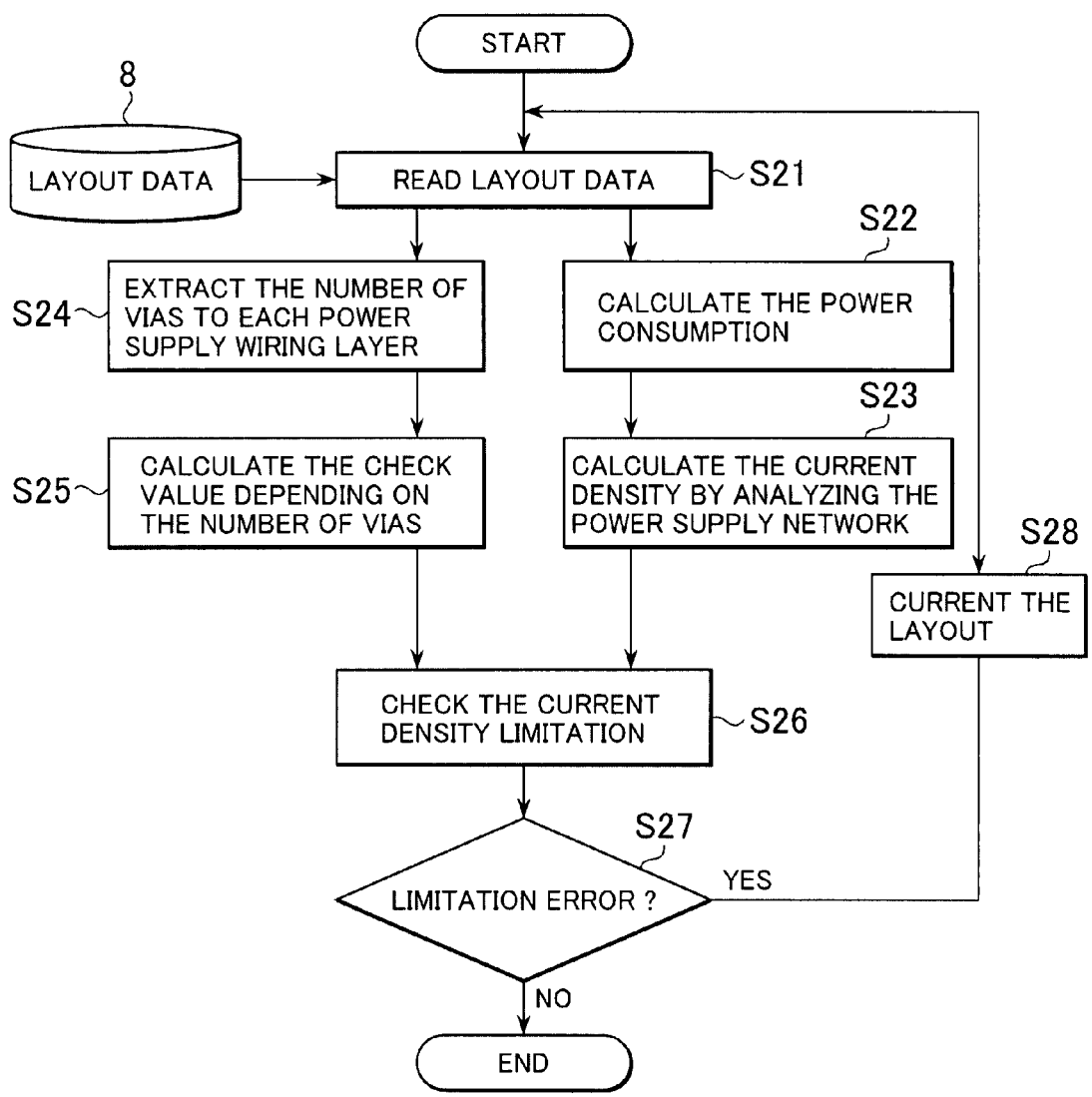
FIG. 3 illustrates a flow chart of the simulation processing by the simulation system of FIG. 1.

FIG. 3 illustrates a flow chart of the simulation processing by the simulation system of FIG. 1. In FIG. 3, the layout data 8 in which alignment and wiring are completed is read by CPU 11 of FIG. 1 (Step S21). The CPU 11 calculates the power consumption by considering output load and soon (Step S22). CPU 11 then recognizes the power supply wiring name and the via name respectively as a node, and calculates the electric current density in each node. The power supply network analysis performed by the CPU 11 considers the alignment position of the node (Step S23).

On the other hand, as shown in FIG. 3, the CPU 11 of FIG. 1 extracts the number of via connections to each power supply wiring layer (Step S24), and calculates the check value corresponding to the number of via connections (Step S25).

Figure 4:
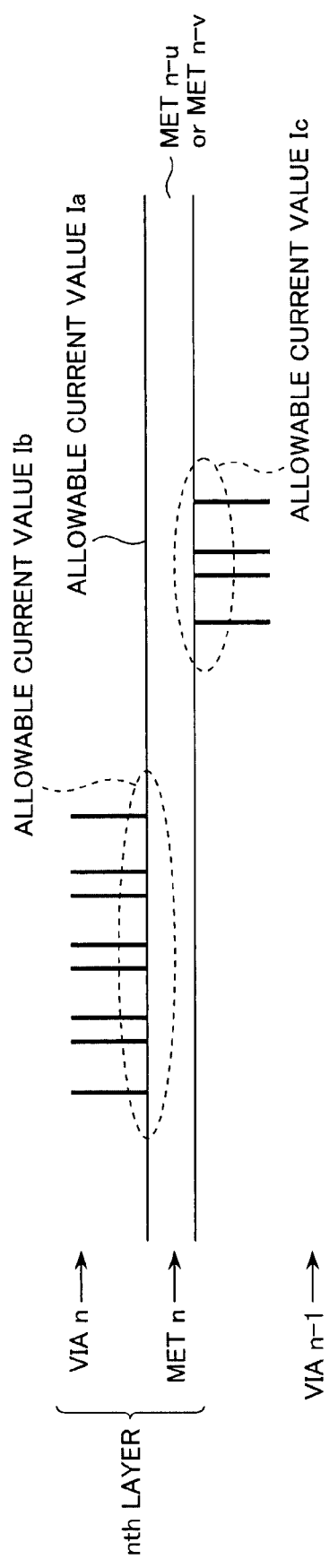
FIG. 4 illustrates a diagram of the allowable current value of the power supply wiring of FIG. 2.

FIG. 4 illustrates a diagram of the allowable current value of the power supply wiring of FIG. 2. In the power supply wiring layer METn, a current value with which either the power supply wiring METn-u or the power supply wiring METn-v of FIG. 2 has the minimum value is calculated as an allowable current value Ia beforehand. Each current value of the power supply wiring METn-u and the power supply wiring METn-v is calculated in accordance with the width of the power wire.

As shown in FIG. 4, the maximum current value among connected field sides between the power supply wiring on the power supply wiring layer METn and the vias on the via n layer connected to the power supply wirings is calculated as the allowable current value Ib. The current value of the connected field side is calculated in accordance with the width of the power supply wiring and the number of vias. Similarly, the maximum current value among connected field sides between the power supply wirings on the power supply wiring layer METn and the vias on the via n−1 layer connected to the power supply wirings is calculated as the allowable current value Ic. The current value of the connected field side is calculated in accordance with the width of the power supply wiring and the number of vias. The number of vias is a number corresponding to each via name of FIG. 2.

As further shown in FIG. 4, the minimum allowable current value among the allowable current value Ia, the allowable current value Ib, and the allowable current value Ic is set as a check value of the power supply wiring layer METn.

As shown in FIG. 3, the CPU 11 of FIG. 1 checks the electric current density limitation (Step S26) by comparing the electric current density calculated in Step 23 and the check value calculated in Step S25. When the electric current density exceeds the check value, the check result is assumed to be a limitation error.

As further shown in FIG. 3, the CPU 11 of FIG. 1 judges whether the check result produced by Step S26 shows the limitation error (Step S27). When the check result shows the limitation error, the operation returns to step S21 and repeats similar processing like the above, after correcting the layout and renewing the layout data 8 (Step S28). On the other hand, when the check result does not show the limitation error, the CPU11 ends the processing of the LSI design simulation.

Figure 5:
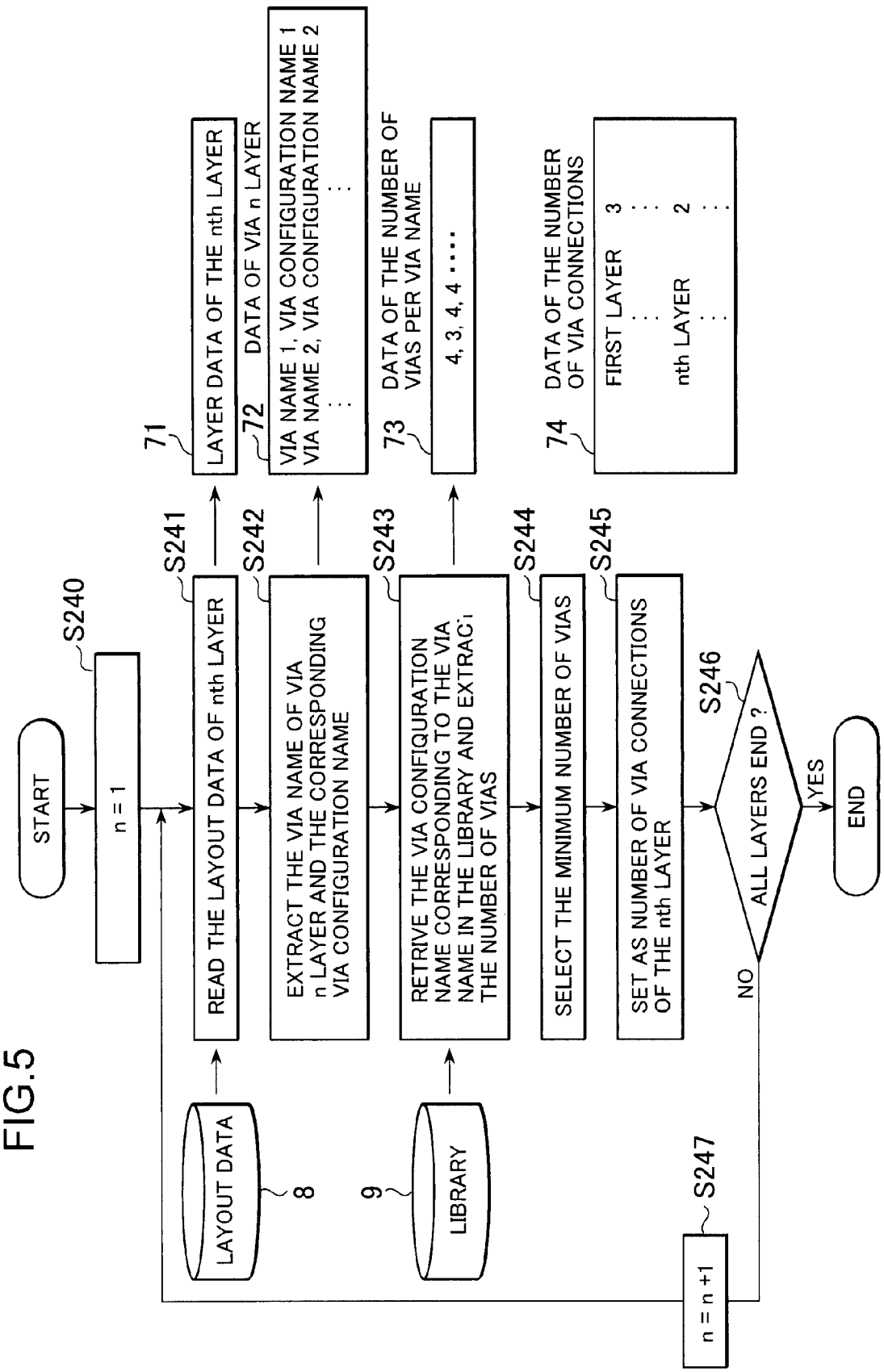
FIG. 5 illustrates a flow chart of the processing in step S24 in FIG. 3.

FIG. 5 illustrates a flow chart of the processing in step S24 in FIG. 3. As shown in FIG. 5, the CPU 11 of FIG. 1 sets n that shows the layer number at 1 (Step S240).

As further shown in FIG. 5, the CPU 11 of FIG. 1 reads the data of n$_{th}$ layer from layout data 8, and outputs it to a work memory area as layout data 71 of a n$_{th}$ layer (Step S241). The CPU11 extracts a via name of the via n$_{th}$ layer and the via configuration name corresponding to the via name from the layout data 71 of n layer, and outputs them to the work memory area as data 72 of the via n layer (Step S242).

As further shown in FIG. 5, the CPU11 of FIG. 1 refers to the data 72 of the via n layer, retrieves the via configuration name corresponding to the via name in library 9, extracts the number of vias, and outputs it per via name as via number data 73 to the work memory area (Step S243). Then, the CPU11 selects the minimum number of vias from the via number data 73 per via name (Step S244), sets it as the number of via connections of the n$_{th}$ layer, and outputs it to the work memory area as via connection data 74 (Step S245).

As further shown in FIG. 5, the CPU 11 of FIG. 1 judges whether it has set the number of via connections to all layers (Step S246). When setting the number of via connections is completed for all layers, the CPU11 ends the processing. On the other hand, when the number of via connections is not completed for all layers, the CPU11 adds 1 to n that shows the layer number (Step S247), returns to Step S241, and repeats the above-mentioned similar processing.

Figure 6:
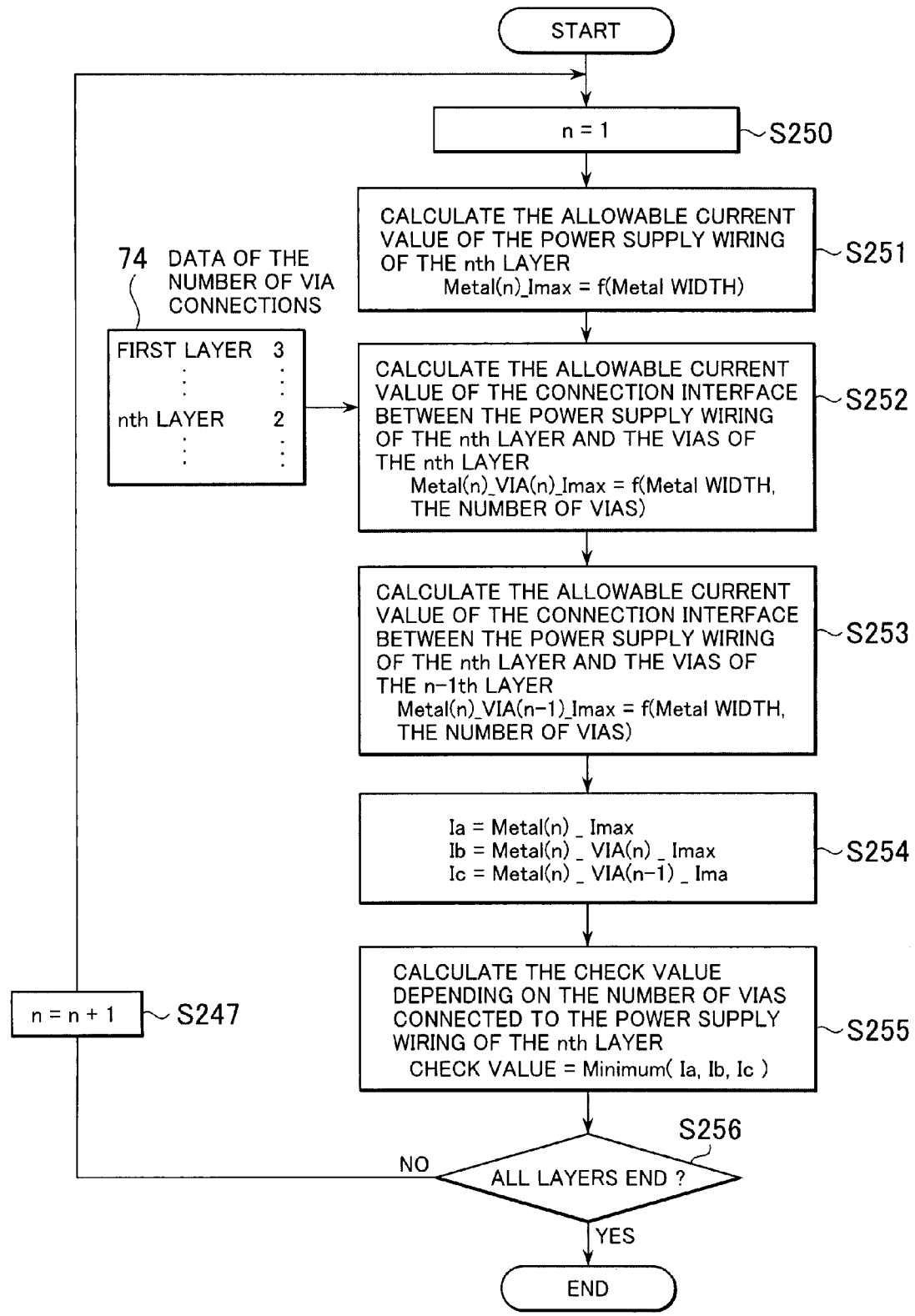
FIG. 6 illustrates a flow chart of the processing in step S25 in FIG. 3.

FIG. 6 illustrates a flow chart of the processing in step S25 in FIG. 3. As shown in FIG. 6, the CPU 11 of FIG. 1 sets n that shows the layer number at 1 (Step S 250).

As further shown in FIG. 6, the CPU 11 of FIG. 1 calculates the allowable current value (Metal (n)_Imax) of the power supply wiring in $n_{th}$ layer (Step S251). The allowable current value (Metal (n)_Imax) of the power supply wiring is calculated by prescribed calculation in which the width of the power supply wiring (Metal width) is given as a variable. It is also possible to acquire the allowable current value (Metal (n)_Imax) of the power supply wiring by referring to a first Table 81 shown in FIG. 7 where the allowable current value of prescribed power supply wiring is corresponded per power supply wiring width as shown in FIG. 7. It is also possible to prepare the first Table 81 shown in FIG. 7 per wiring layer and to refer to the first table 81 shown in FIG. 7 corresponding to the wiring layer is in process.

As further shown in FIG. 6, the CPU 11 of FIG. 1 calculates the allowable current value (Metal (n)_VIA (n)_Imax) of the connected field side between the power supply wiring of the $n_{th}$ layer and the via of the $n_{th}$ layer (Step S252). The CPU11 acquires the number of via connections of the $n_{th}$ layer from the via connection number data 74 that was obtained by the processing of FIG. 5. The allowable current value (Metal (n)_VIA (n)_Imax) of the connected field side is calculated by prescribed calculation in which the width of the power supply wiring (Metal width) and the number of via connections (number of VIAs) are given as variables. It is also possible to acquire the allowable current value (Metal (n)_VIA (n)_Imax) of the connected field side between the power supply wiring of the $n_{th}$ layer and the via of the $n_{th}$ layer by referring to the second table 82 shown in FIG. 8 where the allowable current value is defined by the width (Metal width) of the power supply wiring and the number of via connections (number of VIAs).

As further shown in FIG. 6, the CPU11 of FIG. 1 calculates the allowable current value (Metal (n)_VIA (n−1)_Imax) of the connected field side between the power supply wiring of the $n_{th}$ layer and the vias of the n−1$_{th}$ layer (Step S253). The CPU11 acquires the number of via connections of the $n_{th}$ layer from the via connection number data 74. The allowable current value (Metal (n)_VIA (n−1)_Imax) of the connected field side is calculated by supplying the width (Metal width) of the power supply wiring of the $n_{th}$ layer and the number of via connections of the n−1 layer (number of VIAs) to the same prescribed calculation as Step S252 as variables. It is also possible to acquire the allowable current value (Metal (n)_VIA (n−1)_Imax) of the connected field side between the power supply wiring of the $n_{th}$ layer and the vias of the n−1$_{th}$ layer by referring to the second table 82 shown in FIG. 8 where the allowable current value is defined by the width (Metal width) of the power supply wiring and the number of via connections (number of VIAs).

As further shown in FIG. 6, in Step S252 and Step S253, it is also possible to prepare the second Table 82 per wiring layer and refer to the second Table 82 corresponding to the wiring layer in process.

As further shown in FIG. 6, the CPU 11 of FIG. 1 sets the allowable current value (Metal (n)_Imax) of the power supply wiring of the $n_{th}$ layer calculated in Step S251 to a variable Ia, and sets the allowable current value (Metal (n)_VIA (n)_Imax) of the connected field side between the power supply wiring of the $n_{th}$ layer and the via of the $n_{th}$ layer calculated in Step S252 to a variable Ib, and the allowable current value (Metal (n)_VIA (n−1)_Imax) of the connected field side between the power supply wiring of the $n_{th}$ layer calculated and the via of the n−1 layer calculated in Step S253 to a variable Ic (Step S254).

As further shown in FIG. 6, the CPU 11 of FIG. 1 calculates the check value corresponding to the number of vias connected with the power supply wiring of the $n_{th}$ layer (Step S255). The minimum value among the values set to variables Ia, Ib, and Ic is set as a check value.

The CPU11 of FIG. 1 judges whether it has calculated the check value of all layers (Step S256). When the check value of all layers is calculated, the CPU11 ends the processing. On the other hand, when the check value of all layers is not calculated, the CPU11 adds 1 to n that shows the layer number (Step S257), returns to Step S251, and repeats the above-mentioned processing.

As a result, Ib and Ic are values considered the number of via coupled to the metal layer and not including excessive estimation. The aforementioned embodiment prevents design TAT due to excessive guarantee and chip size increasing.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A method of checking a current density limitation comprising:

calculating a first allowable current value that becomes an allowable current value of a power supply wiring;

extracting a number of vias connected to the power supply wiring;

calculating a second allowable current value that becomes the allowable current value on a connected field side between the power supply wiring and the vias connected to the power supply wiring, the second allowable current value depending on the number of vias and a width of the power supply wiring;

selecting a minimum allowable current value of the first allowable current value and the second allowable current value;

checking by using a computer, the current density limitation based on a result of the selection;

extracting the number of vias connected to the power supply wiring in an upper layer of the power supply wiring layer and the number of vias connected to the power supply wiring in a lower layer of the power supply wiring layer as the number of vias in the extracting;

calculating a third allowable current value that becomes the allowable current value of the connected field side between the power supply wiring and the vias in the upper layer, and a fourth allowable current value that becomes the allowable current value of the connected field side between the power supply wiring and the vias in the lower layer as the second allowable current value in the calculating, the third allowable current value depending on the number of vias in the upper layer and the width of the power supply wiring, the fourth allowable current value depending on the number of vias in the lower layer and the width of the power supply wiring; and comparing the first allowable current value, the third allowable current value and the fourth allowable current value.

2. The method of checking the current density limitation according to claim 1, wherein the first allowable current value is calculated depending on a sectional area of the power supply wiring.

3. The method of checking the current density limitation according to claim 1, wherein:
the second allowable current value is calculated depending on a sectional area of the power supply wiring and the number of vias.

4. The method of checking the current density limitation according to claim 1, wherein:
the third allowable current value is calculated depending on a sectional area of the power supply wiring and the number of vias in the upper layer, and the fourth allowable current value is calculated depending on the sectional area of the power supply wiring and the number of vias in the lower layer.

5. The method of checking the current density limitation according to claim 1, further comprising:
obtaining a via name and the number of vias based on the via configuration information that identifies the configuration of the via;
extracting the via name of the minimum number of vias and the minimum number of vias; and
correlating power supply wiring identification information that identifies the power supply wiring to the via name of the minimum number of vias and the minimum number of vias.

6. The method of checking the current density limitation according to claim 1, wherein:
the checking of the current density limitation is based on a minimum allowable current value in the comparing the first allowable current value and the second allowable current value.

7. An apparatus for checking a current density limitation comprising:
a calculation part configured to calculate a first allowable current value as a maximum allowable current value of a power supply wiring, a second allowable current value as a maximum allowable current value on a connected-field side between the power supply wiring and vias connected to the power supply wiring, a third allowable current value that becomes the allowable current value of the connected field side between the power supply wiring and the vias in an upper layer of the power supply wiring layer, and a fourth allowable current value that becomes the allowable current value of the connected field side between the power supply wiring and the vias in a lower layer of the power supply wiring layer as the second allowable current value, the second allowable current value depending on a number of visa and a width of the power supply wiring, the third allowable current value depending on the number of vias in the upper layer and the width of the power supply wiring, the fourth allowable current value depending on the number of vias in the lower layer and the width of the power supply wiring;
a determination part configured to determine the number of vias connected to the power supply wiring;
a comparison part configured to compare the first allowable current value to the second allowable value;
a selection part configured to select a minimum allowable current value of the first allowable current value and the second allowable current value; and
a check part configured to check the current density limitation using the minimum allowable current value,
wherein: the check part comprises the first allowable current value depending on the sectional area of the power supply wiring, the second allowable current value depending on the number of vias on the connected field side between the vias connected to the first side surface of the power supply wiring and the power supply wiring, and the third allowable current value depending on the number of vias on the connected field side between the vias connected to the second side surface of the power supply wiring and the power supply wiring.

8. The apparatus for checking current density limitation according to claim 7, wherein:
the number of vias is a plurality of vias arranged in a prescribed connection part against the power supply wiring.

9. The apparatus for checking current density limitation according to claim 8, wherein:
the number of vias in the prescribed connection part having the minimum number of vias is determined as the number of vias.

10. The apparatus for checking current density limitation according to claim 7, wherein:
as the check value of the power supply wiring, the check part uses the allowable current value corresponding to the number of vias on the connection surface with the vias connected to the power supply wring.

11. The apparatus for checking current density limitation according to claim 7, wherein:
the check part performs a current density limitation check based on the minimum allowable current value as a result of comparing the first allowable current value, the second allowable current value and the third allowable current value.

12. The apparatus for checking current density limitation according to claim 7, wherein:
the first allowable current value is determined depending on the sectional area of the power supply wiring.

13. The apparatus for checking current density limitation according to claim 7, wherein:
the second allowable current value and the third allowable current value depend on the sectional area of the power supply wiring and the via connection.

14. A method of checking a current density limitation comprising:
calculating a first allowable current value as a maximum allowable current value of a power supply wiring;
determining a number of vias connected to the power supply wiring;
calculating a second allowable current value as a maximum allowable value on a on a connected field side between the power supply wiring and the vias connected to the power supply wiring, the second allowable current value depending on the number of vias and a width of the power supply wiring;
comparing the first allowable current value to the second allowable current value;
selecting a minimum allowable current value of the first allowable current value and the second allowable current value;
checking, by using a computer, the current density limitation using the minimum allowable current value;
extracting the number of vias connected to the power supply wiring in an upper layer of the power supply wiring layer and the number of vias connected to the power supply wiring in a lower layer of the power supply wiring layer as the number of vias in the determining;
calculating a third allowable current value that becomes the allowable current value of the connected field side between the power supply wiring and the vias in the upper layer, and a fourth allowable current value that becomes the allowable current value of the connected field side between the power supply wiring and the vias in the lower layer as the second allowable current value in the calculating; and comparing the first allowable current value, the third allowable current value and the fourth allowable current value.

\* \* \* \* \*

UNITED STATES PATENT AND TRADEMARK OFFICE
CERTIFICATE OF CORRECTION

PATENT NO. : 8,448,125 B2
APPLICATION NO. : 11/979834
DATED : May 21, 2013
INVENTOR(S) : Kenichi Ushiyama It is certified that error appears in the above-identified patent and that said Letters Patent is hereby corrected as shown below:

In the Claims:

In Col. 7, Line 28, In Claim 6, after "in" delete "the".

In Col. 7, Line 47, In Claim 7, delete "visa" and insert -- vias --, therefor.

In Col. 8, Line 22, In Claim 10, delete "wring." and insert -- wiring. --, therefor.

In Col. 8, Line 46, In Claim 14, delete "on a on a" and insert -- on a --, therefor.

Signed and Sealed this
Eighth Day of October, 2013

Teresa Stanek Rea
*Deputy Director of the United States Patent and Trademark Office*